United States Patent

Sarkissian

[15] 3,638,131

[45] Jan. 25, 1972

[54] MULTIPLEXING CIRCUIT WITH STAGE ISOLATION MEANS

[72] Inventor: Vahé Sarkissian, Sunnyvalle, Calif.

[73] Assignee: National Semiconductor Corp., Santa Clara, Calif.

[22] Filed: Sept. 29, 1969

[21] Appl. No.: 861,867

[52] U.S. Cl. ............................330/30 R, 307/243, 330/30 D, 330/38 M

[51] Int. Cl. ............................................................H03f 3/68

[58] Field of Search ..........................330/30, 30 D, 38 M, 69; 328/104, 154; 307/243

[56] References Cited

UNITED STATES PATENTS

| | | | |
|---|---|---|---|
| 3,550,087 | 12/1970 | Ross et al. | 330/65 X |
| 2,863,049 | 12/1958 | Lee et al. | 328/154 |
| 2,966,672 | 12/1960 | Horn | 330/69 X |
| 3,522,450 | 8/1970 | Muenter | 330/30 X |
| 2,900,504 | 8/1959 | Weiss | 328/154 |

*Primary Examiner*—Robert Segal
*Assistant Examiner*—James B. Mullins
*Attorney*—Lowhurst and Hamrick

[57] ABSTRACT

A multiplexing circuit including a plurality of amplifying stages connected in parallel between an output terminal and a common terminal with each stage including an isolating diode, an amplifying transistor, and a switching transistor connected in series, the isolating diodes serving to isolate each stage from disturbances created by the other stages.

7 Claims, 5 Drawing Figures

INVENTOR
VAHE SARKISSIAN
BY Harvey J. Fendelman
ATTORNEY

INVENTOR
VAHE SARKISSIAN
BY Harvey J. [signature]
ATTORNEY

MULTIPLEXING CIRCUIT WITH STAGE ISOLATION MEANS

BACKGROUND OF THE INVENTION

1. Field of the Invention

The present invention relates generally to multiplexing circuit apparatus and, more particularly, to a novel multiplexing circuit and technique for enabling collector-multiplexing of a large number of amplifier stages with no degradation in performance.

2. Discussion of the Prior Art

In integrated circuitry, it is often desirable that a number of input amplifiers be connected in such a manner as to share a common output stage. However, the utility and practicality of such circuitry is dependent upon the ability of the circuit to discriminate against all inputs but the selected one so that the nonselected inputs will not interfere therewith. In prior art circuits, it has been the practice to either assume that no disturbing signals will be input into the nonselected stages during the time that one of the stages is elected, or make the assumption that all signals present will introduce very little coupling into the amplifier that has been selected. But in making these assumptions the circuits are limited in two respects.

The first limitation is that, although one amplifier at a time is selected, the voltage level of the signals input into the various stages must be kept below some critical level, this being that level which will not detrimentally affect the operation of the selected amplifier. This limitation, of course, severely limits the suitability of the simple circuit for application in which the available inputs are likely to exceed the critical input level.

The other limitation involves the effect on the frequency response of a given amplifier due to the inherent capacitances which are introduced into the input thereof by the nonselected amplifying stages. It is common practice in integrated circuitry to couple several similar amplifier stages together by connecting all of the collectors to one point or circuit node so that they share a common output resistance however, the effect of doing this is to add all the stray capacitances or extra capacitances which are present at that particular node into the circuit of the amplifier. This, of course, drastically affects the frequency response of the selected amplifier.

SUMMARY OF THE PRESENT INVENTION

It is therefore a principal object of the present invention to provide a novel multiplexing circuit wherein isolation is provided between the respective ones of several input amplifiers coupled to a common output stage so as to enable operation of the circuit at higher input signal levels than has heretofore been allowable.

Another object of the present invention is to provide a novel multiplexing circuit wherein several input amplifiers are coupled to a common output stage so that very little additional circuit capacitance is added to the output stage with the addition of each input amplifier. Still another object of the present invention is to provide a novel circuit technique that enables collector multiplexing of a practically unlimited number of preamplifier stages with no degradation in performance.

Still another object of the present invention is to provide a novel multiplexing amplifier having a plurality of preamplifying stages with means for isolating the various stages from undesirable effects which would otherwise exist.

In accordance with the present invention a plurality of transistorized amplifying stages are connected to a common output terminal by inserting diodes between the collectors of each amplifier and the common output terminal. The selection of a particular amplifier is performed by switching a current source into the selected amplifier so that only the diodes associated with that amplifier will be conducting and present a low impedance signal path to the output load. Since the current source will not be connected at that instant to any of the other amplifiers, the amplifying transistors will be inactive i.e., no emitter current will be flowing therethrough, the diodes at the collectors thereof will be nonconducting and will present high-impedance signal blocks to low-level interfering input signals. If the signal at the input of any nonselected amplifier exceeds the level at which all amplifiers are in common, the diode will be reverse biased and block these high level signals as well. Consequently, the selected amplifier is isolated from all disturbances that may occur at the input terminals to the other preamplifiers, and high positive voltages up to the breakdown voltage of the inserted diodes can be supplied at the inputs to the various amplifiers during their off conditions without any degradation in the performance of the selected amplifier. For high-level negative signals a diode in series with the current source acts as a block as well.

A significant advantage of the present invention over the prior art is that it enable a large plurality of integrated circuit amplifiers to be collector-multiplexed together without substantially limiting the frequency response of the system. This, of course, is the result of the high-impedance that each of the diodes present at the collectors of the stages that are turned off.

Other advantages of the present invention will become apparent to those skilled in the art after having read the following detailed description of a preferred embodiment which is illustrated in the several figures of the drawing.

IN THE DRAWING

DETAILED DESCRIPTION OF THE PREFERRED EMBODIMENTS

Figure 1:
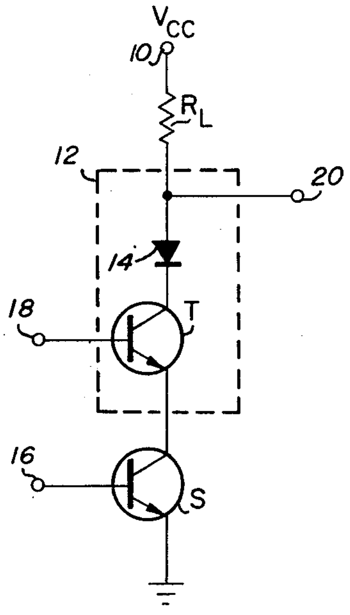
FIG. 1 is a simplified schematic of an amplifier in accordance with the present invention.

Referring now to FIG. 1 of the drawing, there is shown a simple transistorized amplifier stage of the type typically used in IC-multiplexing circuits except that it has been modified in accordance with the present invention. Connected between the terminal 10, to which a collector supply voltage $V_{cc}$ may be applied, and ground is a series circuit comprised of a load resistance $R_L$, an amplifying circuit 12 including a diode 14 and an NPN-transistor T, and a switching transistor S. Connected to the base of the switching transistor S is an input terminal 16 to which an amplifier enabling input may be applied, and connected to the base of the transistor T is an amplifier input terminal 18. The circuit output is taken at output terminal 20.

In operation, with the voltage $V_{cc}$ applied to terminal 10 and an enabling input supplied to terminal 16 of switching transistor S, an output signal can be obtained at output terminal 20 which is responsive to an input signal applied to input terminal 18. However, when the switch S is turned off, no output signal will be obtained at terminal 20 even though an input signal is applied at 18 because of the presence of the diode 14 therebetween which provides a high degree of isolation between the input terminal 18 and the output terminal 20 when reversed biased.

Figure 2:
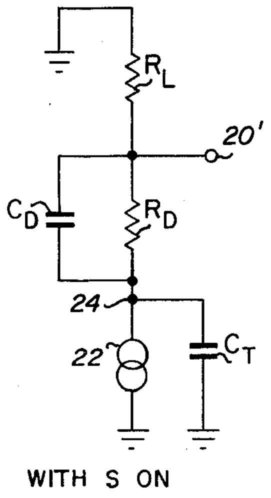
FIG. 2 is an equivalent circuit of the amplifier of FIG. 1 in its on condition.

To illustrate the manner in which the diode 14 provides isolation between the respective input and output terminals, reference is made to FIG. 2 which is an equivalent circuit of the FIG. 1 embodiment with transistor $S_1$ turned on. With the switch S on and an input signal applied to transistor T, the circuit of FIG. 1 can be expressed in terms of a current source 22 in series with the parallel combination of diode forward resistance $R_D$ and diode capacitance $C_D$, and the load resistance $R_L$. There is an inherent collector-to-substrate capacitance of approximately two picofarads associated with the transistor T, and this capacitance $C_T$ is shown coupled between the point 24 and ground. Since the diode 14 can be represented by the small resistance $R_D$, about 26 ohms, and the small capacitance $C_D$, about 0.1 picofarads, only a very small impedance is inserted into the circuit by the addition of the diode 14.

Figure 3:
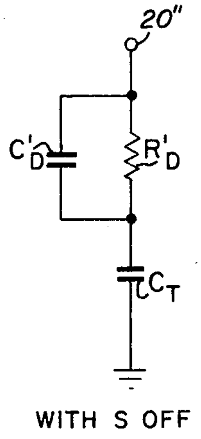
FIG. 3 is an equivalent circuit of the amplifier of FIG. 1 in the off condition.

Turning now to FIG. 3, which is an equivalent circuit of the FIG. 1 embodiment seen looking into the output terminal 20 with the switch S turned off, it will be noted that the diode 14 again may be represented by a capacitance and resistance in parallel, but here the diode 14 will be nonconducting or reverse-biased by a large positive potential appearing at the input terminal 18. Thus, instead of the small resistance which it offers in the forward-biased condition, it now offers a large resistance, approximately 10 megohms, to current introduced at terminal 18. Moreover, since the small capacitance $C_D$ is now in series with the collector-to-substrate-capacitance $C_T$, the capacitance C seen looking into the output terminal 20 is equal to $C=C_DC_T/C_D+C_T$ since $C_T$ is approximately 20 times as large as $C_D$, the total capacitance between the terminal 20'' and ground is approximately one-twentieth that of the capacitance $C_T$ alone. Therefore by inserting the diode 12 into the circuit of FIG. 1, very little effect is produced in the output available at terminal 20 when the switch S is on, but with the switch S off, a considerable change in the characteristics of the circuit is effected.

Although the advantage of such an addition may not immediately be apparent when considering the single stage alone, the improvement will readily be noted when a number of such stages are connected together in parallel to selectively share a common load resistance $R_L$. Whereas similar circuits absent the isolating diode have been utilized in the prior art, they have been limited to the inclusion of a very small number of stages since no means was provided to isolate one stage from another, and as a result, the number of stages which could practically be coupled together was limited since the total capacitance appearing at the output terminal was proportional to the number of stages coupled together. And since the frequency response and consequently the speed of operation of the device are directly affected by the input capacitance, only a very small number of stages could be provided in a single circuit. On the other hand, using the novel technique of the present invention an almost unlimited number of stages can be coupled together.

Figure 4:
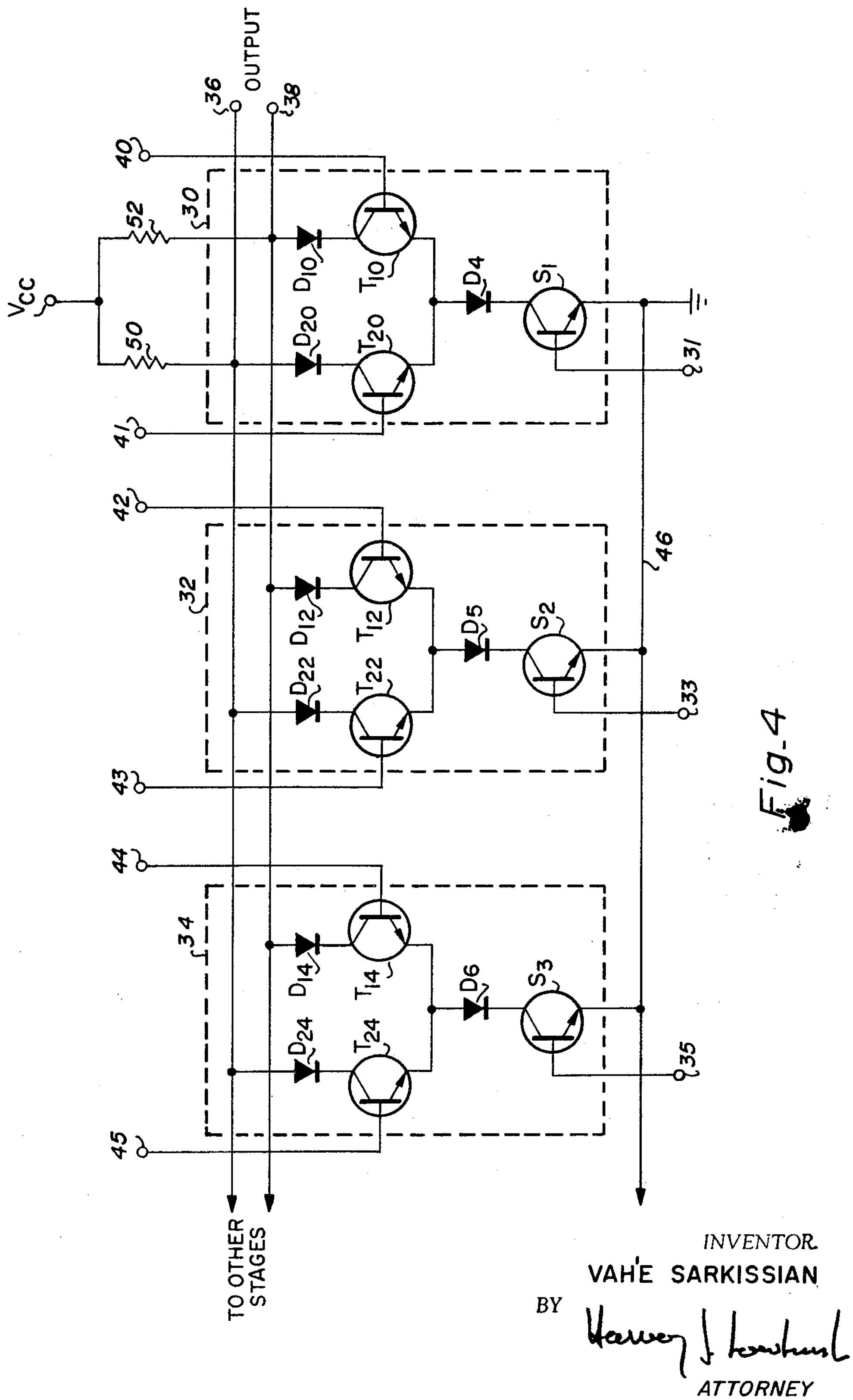
FIG. 4 is a schematic diagram illustrating a multiplexing amplifier having a plurality of differential amplifying stages with isolation means in accordance with the present invention.

The multiplexing circuit of the IC-preamplifier shown in FIG. 4 is comprised of a plurality of differential preamplifying stages 30, 32, and 34 coupled in parallel across the output terminals 36 and 38. Each of the preamplifying stages is comprised of a parallel combination of a pair of the amplifiers shown in FIG. 1 with the transistors T on the left side of each stage coupled through their isolation diodes D to output terminal 36 and the transistors on the right side of each stage coupled through their isolation diodes to the output terminal 38. Each of the stages also includes a switching transistor S having its base connected to one of the switching terminals 31, 33, and 35. Similarly, the bases of the transistors T are respectively coupled to the input terminals 40, 41, 42, 43, 44 and 45 for receiving the input signals to be amplified. The emitters of the switching transistors S are commonly coupled to circuit ground by a line 46 and the collectors thereof are coupled to the emitters of the respective amplifiers by the diodes $D_4$, $D_5$, and $D_6$ which provide additional isolation for protection against negative voltages. The outputs at terminals 36 and 38 are respectively taken across the load resistors 50 and 52.

In operation, the preamplifier input signals are fed into the terminals 40–45 and the selection of one of the preamplifier stages is made by applying a voltage to one of the terminals 31, 33, or 35 so as to turn on the corresponding switch S. As the switch S becomes conductive, a current path is completed from $V_{cc}$ to ground through the selected amplifier stage so as to cause voltage drops across the load resistors 50 and 52 which are proportional to the inputs to the respective transistors T of the activated preamplifier.

If, for example, the amplifier 34 is selected by applying a turn-on voltage to the amplifier selection terminal 35 causing the switching transistor $S_3$ to turn on, the diodes $D_6$, $D_{14}$ and $D_{24}$ will be forward-biased so as to present a low-impedance signal therethrough. Thus, an output will appear at output terminal 36 that is responsive to the input signal applied to input terminal 45 and an output will appear at terminal 38 that is responsive to the input signal applied to input terminal 44. Since during the time that switch $S_3$ is on the switches $S_1$ and $S_2$ are off, thus, in effect open circuiting the current path through the amplifiers 30 and 32, any input signals applied to these amplifiers will produce no effect at the output terminals 36 and 38 since the diodes at the collectors of the respective transistors T will present high impedance blocks to any input signals which might be applied to the terminals 40–43.

Therefore, the amplifier 34 is effectively isolated from all disturbances that might otherwise be introduced thereinto due to signals applied to the input terminals of the other preamplifiers. Because of this isolation, high positive voltages up to the breakdown potential of the isolating diodes can be applied to the inputs of the various other stages during the off periods without producing any degradation in the performance of the selected amplifier.

As mentioned above, isolation from negative voltage is achieved by virtue of the diodes inserted as in the collector circuits of the switching transistors S, and a similar analysis to that described hereinbefore with reference to FIGS. 1, 2, and 3 can be used to explain their operation. As was the case with the isolating diode 14 discussed with reference to FIG. 1, the isolating diodes in the FIG. 4 embodiment, likewise introduce very little impedance into the circuit when forward biased.

Figure 5:
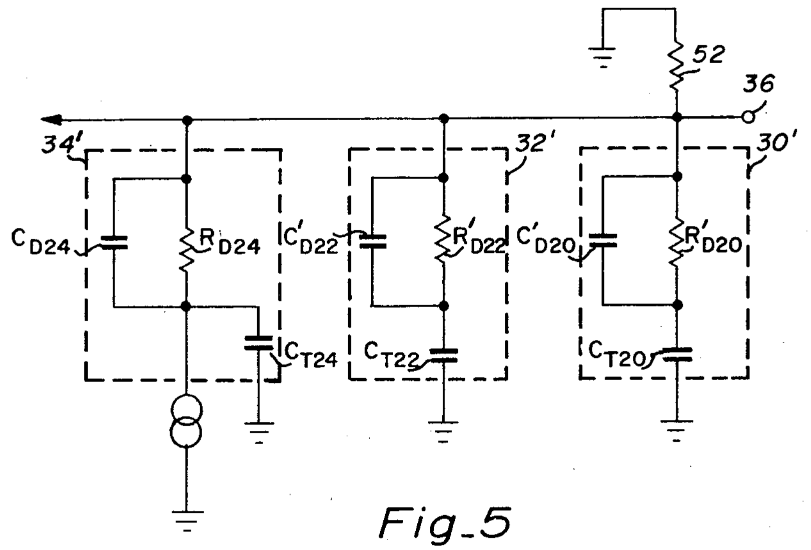
FIG. 5 is an equivalent circuit of the schematic illustrated in FIG. 4.

To further illustrate the advantages obtained in using the present invention in the multiplexing preamplifier embodiment shown in FIG. 4, an equivalent circuit, as seen looking into the output terminal 36 at the respective half-stages, is illustrated in FIG. 5 of the drawing. Since only stage 34' is turned on and the remaining stages 30' and 32' are passive, signals input to the stages 30' and 32' are blocked by the high resistances $R'_{D20}$ and $R'_{D22}$. Whereas in similarly connected prior art circuits which do not include the collector diode, the capacitances $C_T$ were hung directly upon the output terminal in parallel, and since capacitances in parallel add directly, the effect was to hang a very large capacitance across the output terminal having magnitude of which became substantially larger with each additional stage so as to reduce the operational characteristics.

However, by adding the diodes into the circuits using circuit techniques in accordance with the present invention, the small capacitances $C'_{D20}$ and $C'_{D22}$ are respectively put in series with the collector-to-substrate capacitances $C_{T20}$ and $C_{T22}$. And since in integrated circuits of the type described, the diode capacitance is approximately one-twentieth as large as the collector-to-substrate capacitance of each transistor, the effective capacitance introduced into the output by each inactive stage is now approximately one-twentieth of the capacitance which would otherwise be introduced without the diodes. Thus, in accordance with the present invention, many stages can be added to a given integrated circuit without materially affecting the response characteristics of the amplifier network. In integrated circuits of the type described, this scheme of inserting the diodes is accomplished very easily by interchanging one diffusion type by another at the transistor-collector contact.

Although the present invention has been described with particular reference to a circuit including NPN-transistors utilized in a differential preamplifying network, it is to be understood that the inventive principles are equally applicable to other types of circuits wherein a plurality of input stages are to be selectively addressed.

While the invention has been described with reference to specified preferred embodiments, many alterations and modifications of the invention will be apparent to those skilled in the art after having read the foregoing description and it is therefore to be understood that this description is for purposes of illustration only and is in no manner intended to be limiting in any way. I, therefore, intend that the appended claims be interpreted as covering all modifications which fall within the true spirit and scope of my invention.

What is claimed is:

1. A multiplexing circuit, comprising:
- a first terminal for connection to a first source of potential;
- a second terminal for connection to a second source of potential;
- a first output terminal;
- a second output terminal;
- a first load-impedance coupling said first terminal to said first output terminal;
- a second load-impedance coupling said first terminal to said second output terminal; and
- a plurality of amplifying stages coupled in parallel between said output terminals and said second terminal, each of said amplifying stages including;
- a first transistor having a first collector, a first emitter, and a first base for receiving an input signal,
- a first diode coupling said first collector to said first output terminal,
- a second transistor having a second collector, a second emitter, and a second base for receiving another input signal,
- a second diode coupling said second collector to said second output terminal, and
- a switching means coupling said first emitter and said second emitter to said second terminal.

2. A multiplexing circuit as recited in claim 1 wherein each of said amplifying stages further includes a third diode coupling said first and second emitters to said switching means.

3. A multiplexing circuit as recited in claim 2 wherein said switching means includes a third transistor having a third collector coupled to said third diode, a third emitter coupled to said second terminal, and a third base for receiving a switching signal.

4. In a multiplexing circuit having a plurality of differential amplifying stages coupled in parallel between a pair of output terminals and a common terminal, an improved differential amplifying stage, comprising:
- a first diode, a first amplifier and a switching means connected in series between one of said output terminals and said common terminal; and
- a second diode and a second amplifier connected in series between the other of said output terminals and the circuit interconnecting said first amplifier and said switching means.

5. In a multiplexing circuit as recited in claim 4 wherein said first amplifier includes, a first transistor having a first collector coupled to said one output terminal through said first diode, a first emitter coupled to said switching means, and a first base for receiving an input signal; and said second amplifier includes, a second transistor having a second collector coupled to said other output terminal through said second diode, a second emitter coupled to said first emitter, and a second base for receiving another input signal.

6. In a multiplexing circuit as recited in claim 5 wherein said switching means includes a third transistor having a third collector coupled to said first and second emitters, a third emitter coupled to said common terminal, and a third base for receiving a switching signal.

7. In a multiplexing circuit as recited in claim 6 and further comprising a third diode coupling said third collector to said first and second emitters.

* * * * *